United States Patent
Wu et al.

(10) Patent No.: US 7,384,848 B2
(45) Date of Patent: Jun. 10, 2008

(54) METHOD FOR FORMING NON-VOLATILE MEMORY WITH INLAID FLOATING GATE

(75) Inventors: Chun-Pei Wu, Nan-Tao (TW);
Wei-Ming Chung, Taipei (TW);
Huei-Huarng Chen, Chang-Hua (TW)

(73) Assignee: Macronix International Co., Ltd., Hsin-Chu (TW)

( * ) Notice: Subject to any disclaimer, the term of this patent is extended or adjusted under 35 U.S.C. 154(b) by 405 days.

(21) Appl. No.: 11/281,928

(22) Filed: Nov. 18, 2005

(65) Prior Publication Data

US 2007/0117301 A1    May 24, 2007

(51) Int. Cl.
*H01L 21/336* (2006.01)
(52) U.S. Cl. ............................ 438/263; 257/E21.209
(58) Field of Classification Search ........... 438/262, 438/263, 594; 257/E21.209
See application file for complete search history.

(56) References Cited

U.S. PATENT DOCUMENTS 4,997,781 A * 3/1991 Tigelaar .................. 438/257
6,812,099 B2 * 11/2004 Lin et al. ................ 438/262
6,875,660 B2 * 4/2005 Hung et al. .............. 438/257

* cited by examiner

*Primary Examiner*—Chandra Chaudhari
(74) *Attorney, Agent, or Firm*—Birch, Stewart, Kolasch & Birch, LLP

(57) ABSTRACT

A method for forming a non-volatile memory with inlaid floating gate is disclosed. The method comprises the following steps. A substrate having a pad dielectric layer and a first dielectric layer thereon is provided. Then a buried diffusion region is formed in the substrate. Next a second dielectric layer is formed over the substrate and the second dielectric layer and the pad dielectric layer are then etched back to expose the buried diffusion region and the first dielectric layer. Then a shallow trench isolation is formed into the expose the buried diffusion region and the substrate. Next a floating gate pattern is transferred into the first and second dielectric layers. Next the first dielectric layer is removed to expose the pad dielectric layer. Then the exposed pad dielectric layer is removed to expose the substrate. Next a tunnel dielectric layer is formed on the exposed substrate. Next a first conductive layer is conformally formed over the substrate and is planarized to expose the shallow trench isolation. Then an inter gate dielectric layer is formed over the first conductive layer and the shallow trench isolation. Finally a second conductive layer is formed over the inter gate dielectric layer.

20 Claims, 5 Drawing Sheets

METHOD FOR FORMING NON-VOLATILE MEMORY WITH INLAID FLOATING GATE

BACKGROUND OF THE INVENTION

1. Field of the Invention

The present invention relates to a method for forming a non-volatile memory, and more particularly to a method for forming a flash memory with an inlaid floating gate.

2. Description of the Related Art

Non-volatile semiconductor memory devices, such as EEPROM and "flash" devices, are both electrically erasable and writable (or programmable). Such devices retain data even after power is shut down. Similarly, erasable programmable logic integrated circuits (EPLD, or PLD) use non-volatile memory cells to achieve certain reprogrammable logic functions. Non-volatile memory devices and PLDs, have a limited lifetime due to the endurance related stress such devices suffer each time they go through a program-erase cycle. The endurance of such devices is its ability to withstand a given number of program-erase cycles.

A main component of a cell of a non-volatile memory device or a PLD, is a floating gate, in a field effect transistor structure, disposed over but insulated from a channel region which is disposed between a source region and a drain region in a semiconductor substrate. A control or select gate is generally disposed over the floating gate, and is insulated therefrom by a dielectric layer. Alternatively, a control "gate" can be implemented by an adjacent diffused region of the substrate that is also insulated from the floating gate. The floating gate is, therefore, surrounded by an electrically insulating dielectric.

The threshold voltage is the minimum amount of voltage that must be applied to the control gate before the transistor is turned "on" to permit conduction between its source and drain regions, and is a function of the level of charge on the floating gate. The control gate acts as a word line to enable reading or writing of a single selected cell in a two-dimensional array of cells (i.e., a non-volatile memory device or PLD).

A cell is "programmed" by applying the control gate and its source and drain regions at appropriate voltages so that electrons travel from the substrate through an intervening oxide layer (i.e., a tunnel oxide layer or a tunnel oxide) and onto the floating gate. If enough electrons are collected on the floating gate, the conductivity of the channel of the field effect transistor of the cell is changed. By measuring the conductivity of the cell, it is determined whether a binary "1" or "0" is being stored. Since the floating gate of the cell is well insulated, the cell is not volatile and retains its charge for an indefinite period without any power being applied to it.

A cell or group of cells in a non-volatile memory device or a PLD, are also "erasable." During erasing, the control gate, the source, the substrate and the drain regions, of a cell are held at a potential that causes electrons to move back through the tunnel oxide and into the substrate, usually the source region of the substrate. This movement reverses the effect of an earlier program operation.

Reliability assurance is a costly, time consuming, difficult and important task in integrated circuit (IC) development and production. This is particularly true with non-volatile memory devices and PLDs. Such devices are subject to the usual IC failure mechanisms such as package and bonding failures, electrostatic discharge, electromigration, oxide breakdown, etc. Additionally, such devices must meet other reliability requirements. For example, they must retain data for ten years and must function normally (within specifications) after repeated program and erase operations, i.e., program-erase cycles.

It is known that charge loss from a floating gate of a cell of a non-volatile memory device or a PLD is caused, in part, by positive ions (such as sodium) which are disposed in the oxide layer surrounding the floating gate. These positive ions are free to combine with electrons collected on the floating gate. The combination of positive ions with electrons results in a net charge loss from the floating gate and weakens the data retention capability of a non-volatile memory device or a PLD.

It is also known that charge loss from a floating gate of a cell of a non-volatile memory device or a PLD can occur because of damage of the tunnel oxide. The tunnel oxide could be damaged or harmed amid various processes performed after the formation of the tunnel oxide. It is etching processes, especially the etching of the floating gate, that cause tunnel oxide damages and renders the tunnel oxide unreliable. Thus damage of the tunnel oxide induced by etching must be solved since it would further cause severe charge loss amid alternatively programming and erasing the floating gate, i.e., program-erase cycling. Furthermore, the scenario could become worse as the tunnel oxide thicknesses are further reduced, and present weak data retention capability since the tunnel oxide already lost their function.

In view of the drawbacks mentioned with the prior art process, there is a continued need to develop new and improved processes that overcome the disadvantages associated with prior art processes. The advantages of this invention are that it solves the problems mentioned above.

SUMMARY OF THE INVENTION

It is therefore an object of the invention to provide a method for forming a non-volatile memory with an inlaid floating gate and tunnel oxide formed just before the formation of the inlaid floating gate so that the tunnel oxide will not be damaged during the flash cell manufacturing process.

It is another object of this invention to provide a new non-volatile memory structure that can prevent any process issues and device failures resulting from the etching processes of the floating gates.

It is a further object of this invention to provide a novel method for forming a reliable non-volatile memory structure whose floating gates are inlaid and no etching process is applied on the floating gates.

To achieve these objects, and in accordance with the purpose of the invention, the invention uses a method for forming a flash memory with an inlaid floating gate. The method comprises the following steps. A substrate having a pad dielectric layer and a first dielectric layer thereon is provided. Then a buried diffusion region is formed in the substrate. Next a second dielectric layer is formed over the substrate and the second dielectric layer and the pad dielectric layer are then etched back to expose the buried diffusion region and the first dielectric layer. Then a shallow trench isolation is formed into the expose the buried diffusion region and the substrate. Next a floating gate pattern is transferred into the first and second dielectric layers. Next the first dielectric layer is removed to expose the pad dielectric layer. Then the exposed pad dielectric layer is removed to expose the substrate. Next a tunnel dielectric layer is formed on the exposed substrate. Next a first conductive layer is conformally formed over the substrate and is planarized to expose the shallow trench isolation. Then an inter gate dielectric layer is formed over the first conductive layer and the shallow trench isolation. Finally a second conductive layer is formed over the inter gate dielectric layer.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow. The present invention can be practiced in conjunction with various integrated circuit fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 1A:
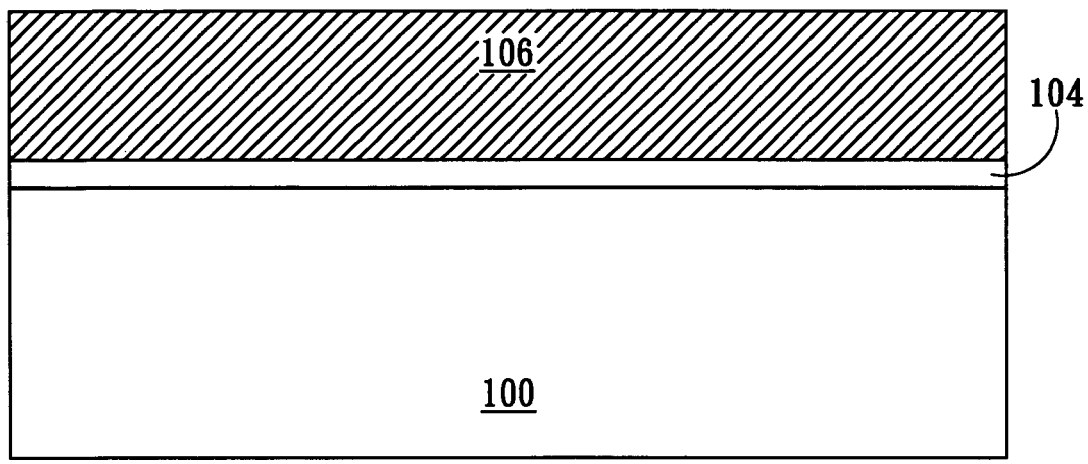
FIG. 1A shows a substrate having a pad dielectric layer and a dielectric layer thereon.
Figure 1B:
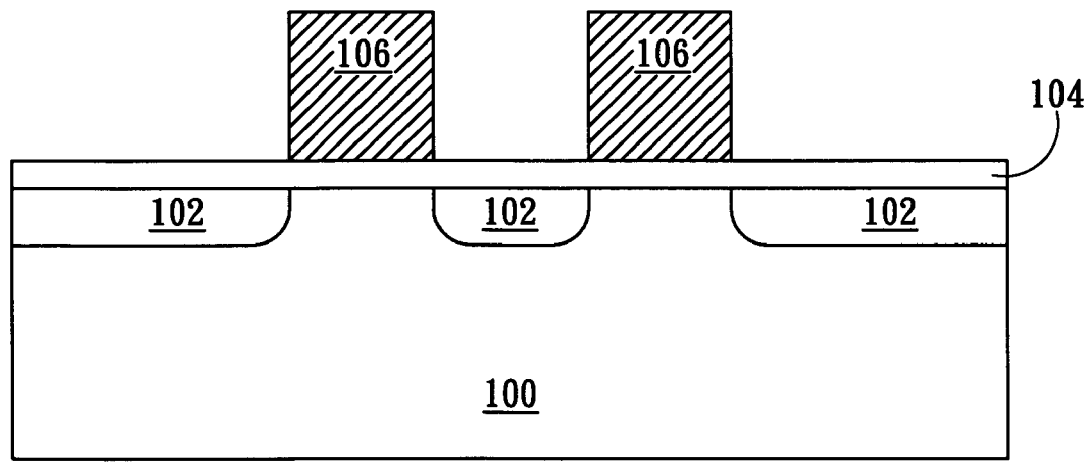
FIG. 1B shows a result of etching the dielectric layer to expose the pad dielectric layer and form buried diffusion regions in the substrate.

The method for forming the non-volatile memories with inlaid floating gates will be described as the following. Referring to FIG. 1A, a substrate 100 having a pad dielectric layer 104 and a dielectric layer 106 thereon is shown. The substrate 100 preferably comprises, but is not limited to: a silicon substrate with a <100> crystalline orientation. The pad dielectric layer 104 is firstly formed on the substrate 100. The pad dielectric layer 104 can be formed by oxidation methods in the art. Then a dielectric layer 106 such as a silicon nitride layer is formed over the pad dielectric layer 104 by using processes such as chemical vapor deposition processes. Referring to FIG. 1B, the dielectric layer 106 is etched to expose the pad dielectric layer 104 by photolithography and etching processes. Then buried diffusion (BD) regions 102 are formed in the substrate 100 by photolithography, etching, ion implantation and rapid thermal process.

Figure 1C:
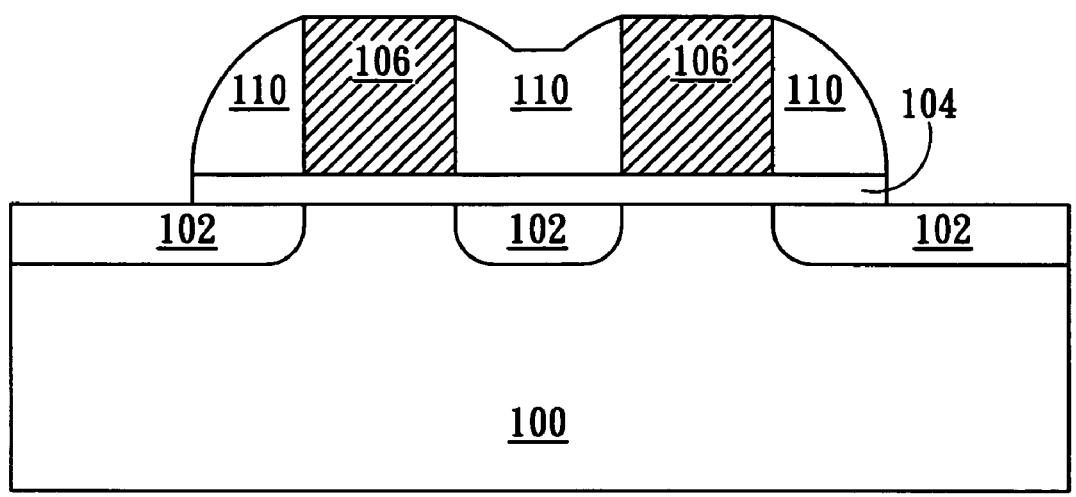
FIG. 1C shows results of forming a dielectric layer over the substrate and then etching back the dielectric layer to expose the buried diffusion regions.
Figure 1D:
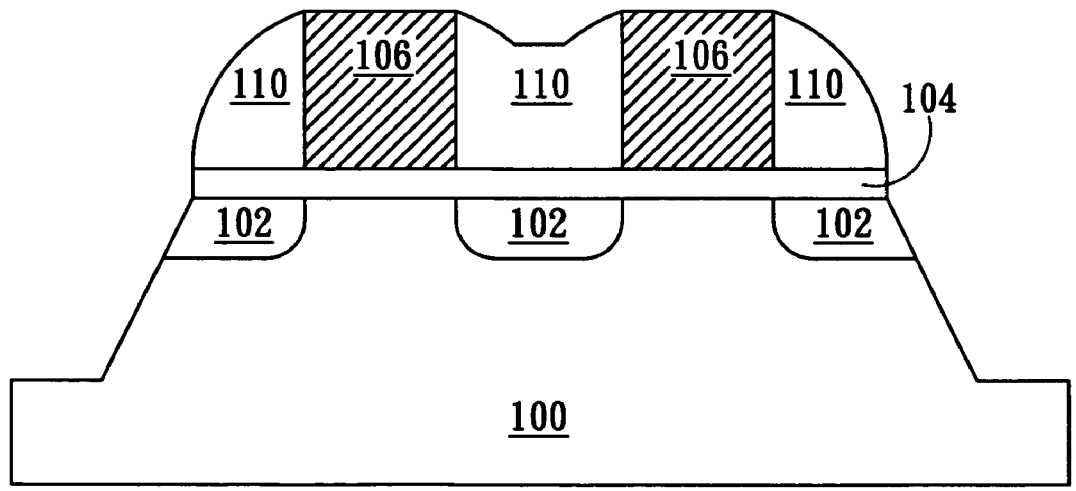
FIG. 1D shows a result of etching the exposed buried diffusion regions to form trenches.
Figure 1E:
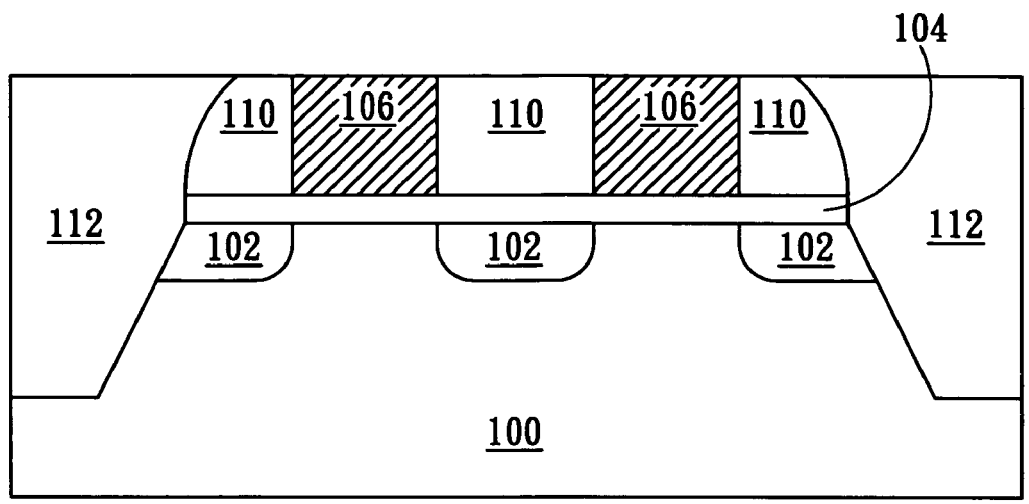
FIG. 1E shows results of forming an oxide layer into the trenches to form shallow trench isolations in the substrate and then planarizing the oxide layer to expose the dielectric layer.

Referring to FIG. 1C, a dielectric layer 110 comprising a silicon dioxide layer is formed over the structure shown in FIG. 1B. The dielectric layer 110 and the pad dielectric layer 104 are then etched back to expose the buried diffusion regions 102 by etching methods. Referring to FIG. 1D, the exposed buried diffusion regions 102 are etched to form trenches. Referring to FIG. 1E, an oxide layer is filled into the trenches to form shallow isolation isolations 112 in the substrate 100 and the oxide layer is planarized to expose the dielectric layer 106 and the dielectric layer 110 by chemical mechanical polishing processes. The oxide layer comprises a high density plasma (HDP) oxide layer.

Figure 1F:
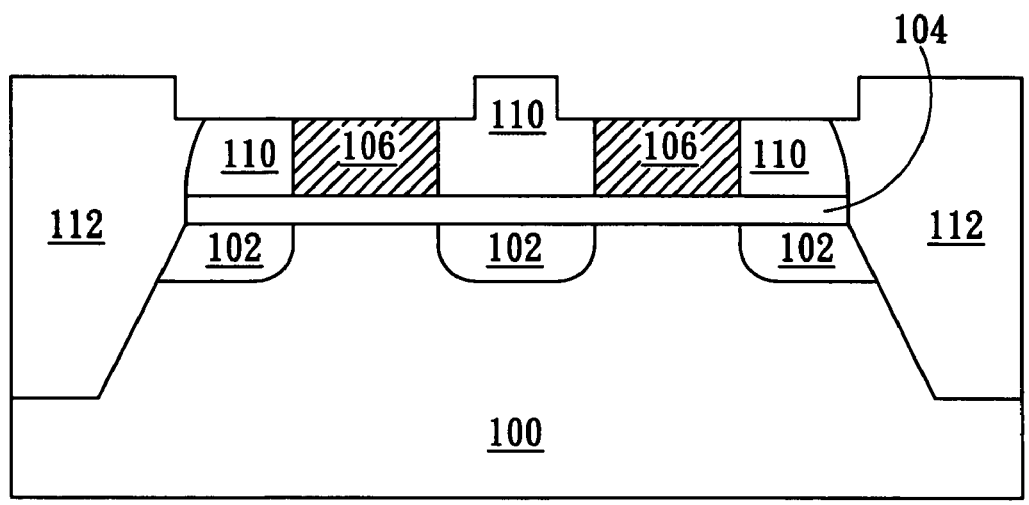
FIG. 1F shows a result of etching the dielectric layer to form a floating gate pattern.

Referring to FIG. 1F, the dielectric layers 106 and 110 are etched to form a floating gate pattern by photolithography and etching processes. Particularly, the floating gate pattern is formed by the following steps. First of all, a photoresist layer is formed on the shallow trench isolations 112, the dielectric layers 106 and 110. Then a planar floating gate pattern is transferred into the photoresist layer by a photolithography process. Finally, the shallow trench isolations 112, the dielectric layers 106 and 110 are etched to form the floating gate pattern.

Figure 1G:
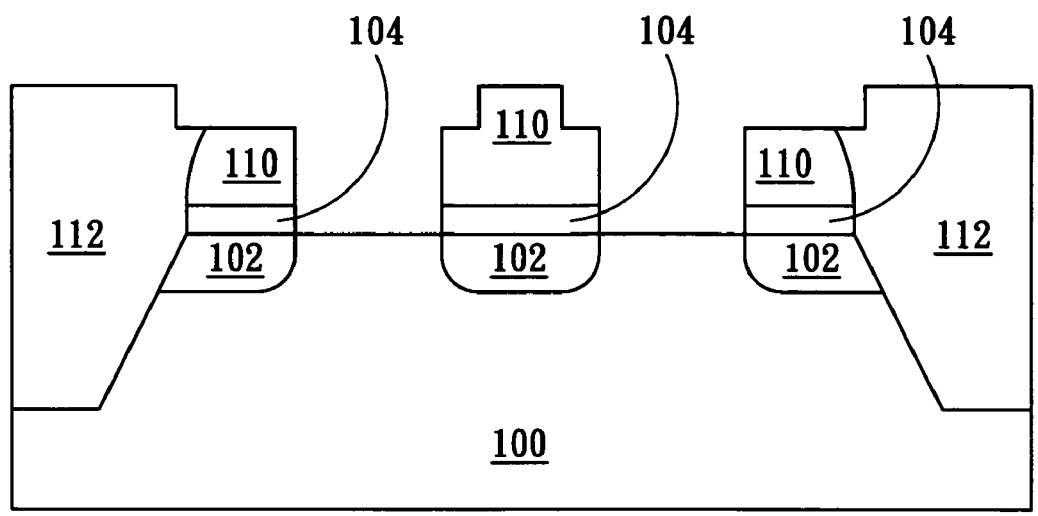
FIG. 1G shows a result of removing the dielectric layer and the pad dielectric to expose the substrate.
Figure 1H:
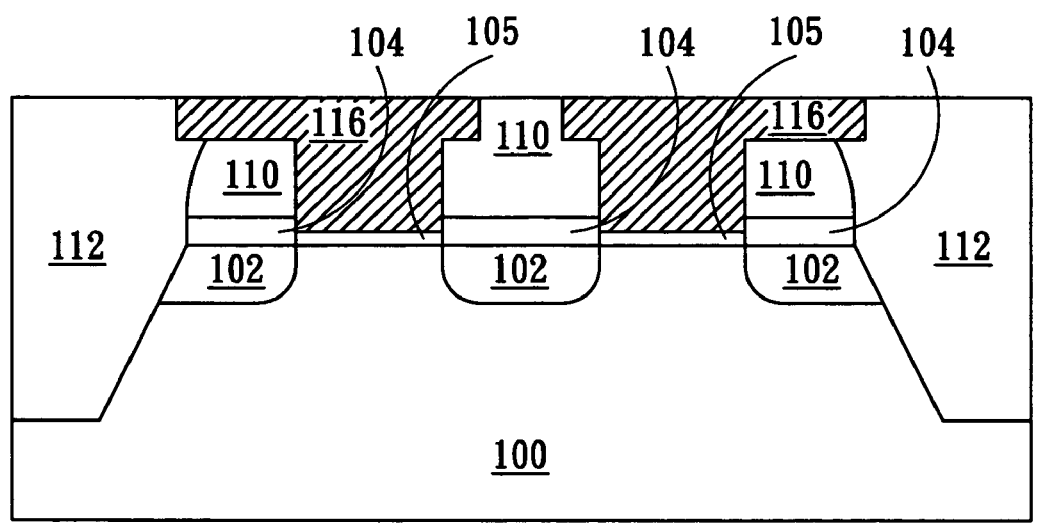
FIG. 1H shows results of sequentially forming a tunnel oxide layer and a conductive layer on the exposed substrate and then planarizing the conductive layer to expose the dielectric layer and the shallow trench isolations.

Referring to FIG. 1G, the dielectric layer 106 is removed to expose a portion of the pad dielectric layer 104 and then the exposed pad dielectric layer 104 is removed to expose the substrate 100. Referring to FIG. 1H, a tunnel dielectric layer 105 is formed on the exposed substrate 100 and a conductive layer 116 comprising a polysilicon layer is then formed on the tunnel dielectric layer 105 and the dielectric layer 110 and is planarized by a chemical mechanical polishing process to expose the dielectric layer 110 and the shallow trench isolations 112.

Figure 1I:
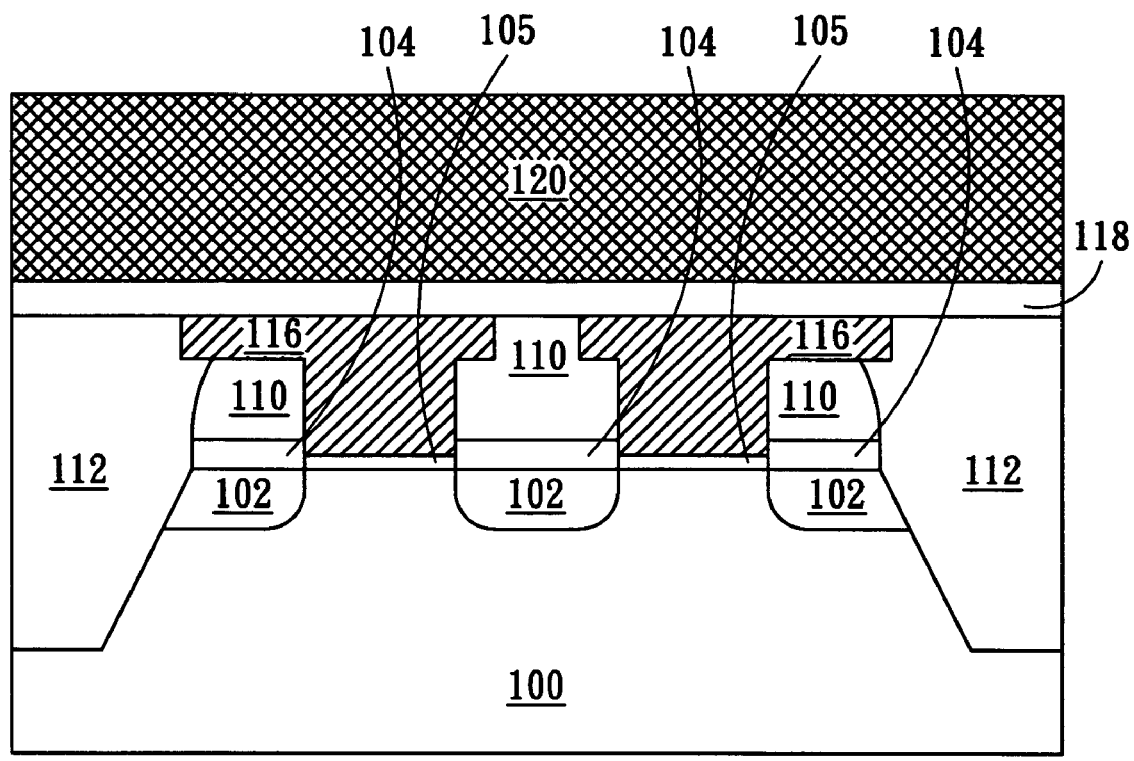
FIG. 1I shows a result of sequentially form an inter gate dielectric layer and a conductive layer on the structure shown in FIG. 1H.

Referring to FIG. 1I, an inter gate dielectric layer 118 is formed on the structure shown in FIG. 1H and a conductive layer 120 is then formed on the inter gate dielectric layer 118. The inter gate dielectric layer 118 comprises an oxide-nitride-oxide (ONO) layer and the conductive layer comprises a polysilicon layer.

The invention provides a method for forming a non-volatile memory with an inlaid floating gate and tunnel oxide formed just before the formation of the inlaid floating gate so that the tunnel oxide will not be damaged during the flash cell manufacturing process. The method thus provides a new non-volatile memory structure that can prevent any process issues and device failures resulting from the etching processes of the floating gates. This reliable non-volatile memory structure has inlaid floating gates and no etching process is applied on the floating gates.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. A method for forming a flash memory with an inlaid floating gate, said method comprising:
providing a substrate having a pad dielectric layer and a first dielectric layer on said pad dielectric layer thereon;

transferring a buried diffusion region pattern into said first dielectric layer to expose said pad dielectric layer;
forming a buried diffusion region in said substrate;
forming a second dielectric layer over said substrate;
etching back said second dielectric layer and said pad dielectric layer to expose said buried diffusion region and said first dielectric layer;
etching said buried diffusion region to form trenches;
forming shallow trench isolations in said trenches;
transferring a floating gate pattern into said first and said second dielectric layers;
removing said first dielectric layer to expose a portion of said pad dielectric layer;
removing said exposed pad dielectric layer to expose said substrate;
forming a tunnel dielectric layer on said exposed substrate;
forming a first conductive layer on said tunnel dielectric layer and said substrate;
planarizing said first conductive layer to expose said shallow trench isolations;
forming an inter gate dielectric layer on said first conductive layer and said shallow trench isolations; and
forming a second conductive layer on said inter gate dielectric layer.

2. The method according to claim 1, wherein said first conductive layer comprises a polysilicon layer.

3. The method according to claim 1, wherein said first dielectric layer comprises a silicon nitride layer.

4. The method according to claim 1, wherein said second dielectric layer comprises a silicon oxide layer.

5. The method according to claim 1, wherein said buried diffusion region is formed by ion implantation and thermal processing methods.

6. The method according to claim 1, wherein said shallow trench isolation is formed by filling a high density plasma oxide layer into said trench.

7. The method according to claim 1, wherein said first conductive layer is planarized by a chemical mechanical polishing process.

8. The method according to claim 1, wherein said second conductive layer comprises a polysilicon layer.

9. A method for forming a flash memory with an inlaid floating gate, said method comprising:
providing a substrate having a pad dielectric layer and a first dielectric layer on said pad dielectric layer thereon;
transferring a buried diffusion region pattern into said first dielectric layer to expose said pad dielectric layer;
forming a buried diffusion region in said substrate;
forming a second dielectric layer over said substrate;
etching back said second dielectric layer and said pad dielectric layer to expose said buried diffusion region and said first dielectric layer;
etching said buried diffusion region to form trenches;
forming an oxide layer into said trenches and on said substrate;
planarizing said oxide layer to expose said first dielectric layer and said second dielectric layer;
transferring a floating gate pattern into said first and said second dielectric layers;
removing said first dielectric layer to expose a portion of said pad dielectric layer;
removing said exposed pad dielectric layer to expose said substrate;
forming a tunnel dielectric layer on said exposed substrate;
forming a first conductive layer on said tunnel dielectric layer and said substrate;
planarizing said first conductive layer to expose said shallow trench isolations;
forming an inter gate dielectric layer on said first conductive layer and said shallow trench isolations; and
forming a second conductive layer on said inter gate dielectric layer.

10. The method according to claim 9, wherein said first and second conductive layers comprise polysilicon layers.

11. The method according to claim 9, wherein said first dielectric layer comprises a silicon nitride layer.

12. The method according to claim 9, wherein said second dielectric layer comprises a silicon dioxide layer.

13. The method according to claim 9, wherein said buried diffusion region is formed by ion implantation and rapid thermal processing methods.

14. The method according to claim 9, wherein said oxide layer comprises a high density plasma oxide layer.

15. The method according to claim 9, wherein said first conductive layer and said oxide layer are planarized by chemical mechanical polishing processes.

16. A method for forming a flash memory with an inlaid floating gate, said method comprising:
providing a silicon substrate having a pad dielectric layer and a first dielectric layer on said pad dielectric layer thereon;
transferring a buried diffusion region pattern into said first dielectric layer to expose said pad dielectric layer;
forming a buried diffusion region in said silicon substrate by ion implantation and thermal processing methods;
forming a second dielectric layer over said silicon substrate;
etching back said second dielectric layer and said pad dielectric layer to expose said buried diffusion region and said first dielectric layer;
etching said buried diffusion region to form trenches;
forming an oxide layer into said trenches and on said silicon substrate;
planarizing said oxide layer to expose said first dielectric layer and said second dielectric layer;
transferring a floating gate pattern into said first and said second dielectric layers;
removing said first dielectric layer to expose a portion of said pad dielectric layer;
removing said exposed pad dielectric layer to expose said silicon substrate;
forming a tunnel dielectric layer on said exposed silicon substrate;
forming a first conductive layer on said tunnel dielectric layer and said silicon substrate;
planarizing said first conductive layer to expose said shallow trench isolations;
forming an oxide-nitride-oxide layer on said first conductive layer and said shallow trench isolations; and
forming a second conductive layer on said oxide-nitride-oxide layer.

17. The method according to claim 16, wherein said first and second conductive layers comprise polysilicon layers.

18. The method according to claim 16, wherein said first dielectric layer comprises a silicon nitride layer.

19. The method according to claim 16, wherein said second dielectric layer comprises a silicon dioxide layer.

20. The method according to claim 16, wherein said oxide layer comprises a high density plasma oxide layer.

* * * * *